US011199586B2

(12) United States Patent
Carrieri et al.

(10) Patent No.: US 11,199,586 B2
(45) Date of Patent: Dec. 14, 2021

(54) JTAG SCANS THROUGH PACKETIZATION

(71) Applicant: Intel Corporation, Santa Clara, CA (US)

(72) Inventors: Enrico D. Carrieri, Placerville, CA (US); John W. Kitterman, Olympia, WA (US); Keith A. Jones, DuPont, WA (US)

(73) Assignee: Intel Corporation, Santa Clara, CA (US)

( * ) Notice: Subject to any disclaimer, the term of this patent is extended or adjusted under 35 U.S.C. 154(b) by 853 days.

(21) Appl. No.: 15/837,462

(22) Filed: Dec. 11, 2017

(65) Prior Publication Data
US 2019/0033375 A1    Jan. 31, 2019

Related U.S. Application Data

(60) Provisional application No. 62/575,863, filed on Oct. 23, 2017.

(51) Int. Cl.
*G01R 31/3185* (2006.01)
*G01R 31/317* (2006.01)

(52) U.S. Cl.
CPC ........... *G01R 31/318597* (2013.01); *G01R 31/31705* (2013.01); *G01R 31/318566* (2013.01); *G01R 31/318572* (2013.01); *G01R 31/318591* (2013.01)

(58) Field of Classification Search
CPC .... G01R 31/318597; G01R 31/318591; G01R 31/318566; G01R 31/31705; G01R 31/318572
See application file for complete search history.

(56) References Cited

U.S. PATENT DOCUMENTS

| 7,003,698 | B2* | 2/2006 | Glass | G06F 11/3656 |
| | | | | 714/30 |
| 7,017,081 | B2* | 3/2006 | Gomez | G01R 31/318533 |
| | | | | 714/30 |
| 2006/0193260 | A1* | 8/2006 | George | H04L 47/245 |
| | | | | 370/235 |
| 2008/0080492 | A1* | 4/2008 | Pyeon | G11C 5/066 |
| | | | | 370/389 |
| 2013/0124934 | A1* | 5/2013 | Jones | G01R 31/31908 |
| | | | | 714/727 |

OTHER PUBLICATIONS

T. Fryza, "The understanding of communication packets structure for microcontrollers debugging," 2008 18th International Conference Radioelektronika, Prague, Czech Republic, 2008, pp. 1-4. (Year: 2008).*

* cited by examiner

*Primary Examiner* — Cynthia Britt
(74) *Attorney, Agent, or Firm* — Schwegman Lundberg & Woessner, P.A.

(57) ABSTRACT

A Joint Test Access Group (JTAG) device can include a Joint Test Access Group (JTAG) port, transport layer circuitry to provide a communication to and from a debug device, and packet interpreter circuitry communicatively coupled between the JTAG port and the transport layer circuitry, the packet interpreter circuitry to translate data in a packet from the debug device into a sequence of bits to be provided to the JTAG port.

25 Claims, 9 Drawing Sheets

JTAG SCANS THROUGH PACKETIZATION

CROSS-REFERENCE TO RELATED APPLICATION

This patent application claims the benefit of U.S. Provisional Patent Application No. 62/575,863, filed Oct. 23, 2017, entitled "IMPROVING JTAG SCANS THROUGH PACKETIZATION", which is incorporated by reference herein in its entirety.

TECHNICAL FIELD

Embodiments pertain to improving Joint Test Action Group (JTAG) communications and operations. Some embodiments relate to reducing latency in JTAG communications or operations.

BACKGROUND

JTAG was standardized in 1990 in the Institute of Electrical and Electronics Engineers (IEEE) standard 1149. JTAG is commonly used for board level testing, device testing, system testing, diagnosis, and fault isolation. A JTAG adapter uses JTAG to transport and access on-chip debug utilities. Thus, JTAG can be used for debugging hardware, software, or firmware. Many common computer architectures, such as Advanced Reduced Instruction Set Computer (RISC) Machines (ARM) and Million Instructions Per Second (MIPS), include variations of JTAG. Field Programmable Gate Arrays (FPGAs) can be debugged using JTAG. A device can be programmed and debugged through a JTAG port, and similarly, a memory may be populated through a JTAG port. JTAG boundary scan technology provides access to device pin state, such as in a boundary scan register (BSR). JTAG provides an ability to test and control the states of the pins.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
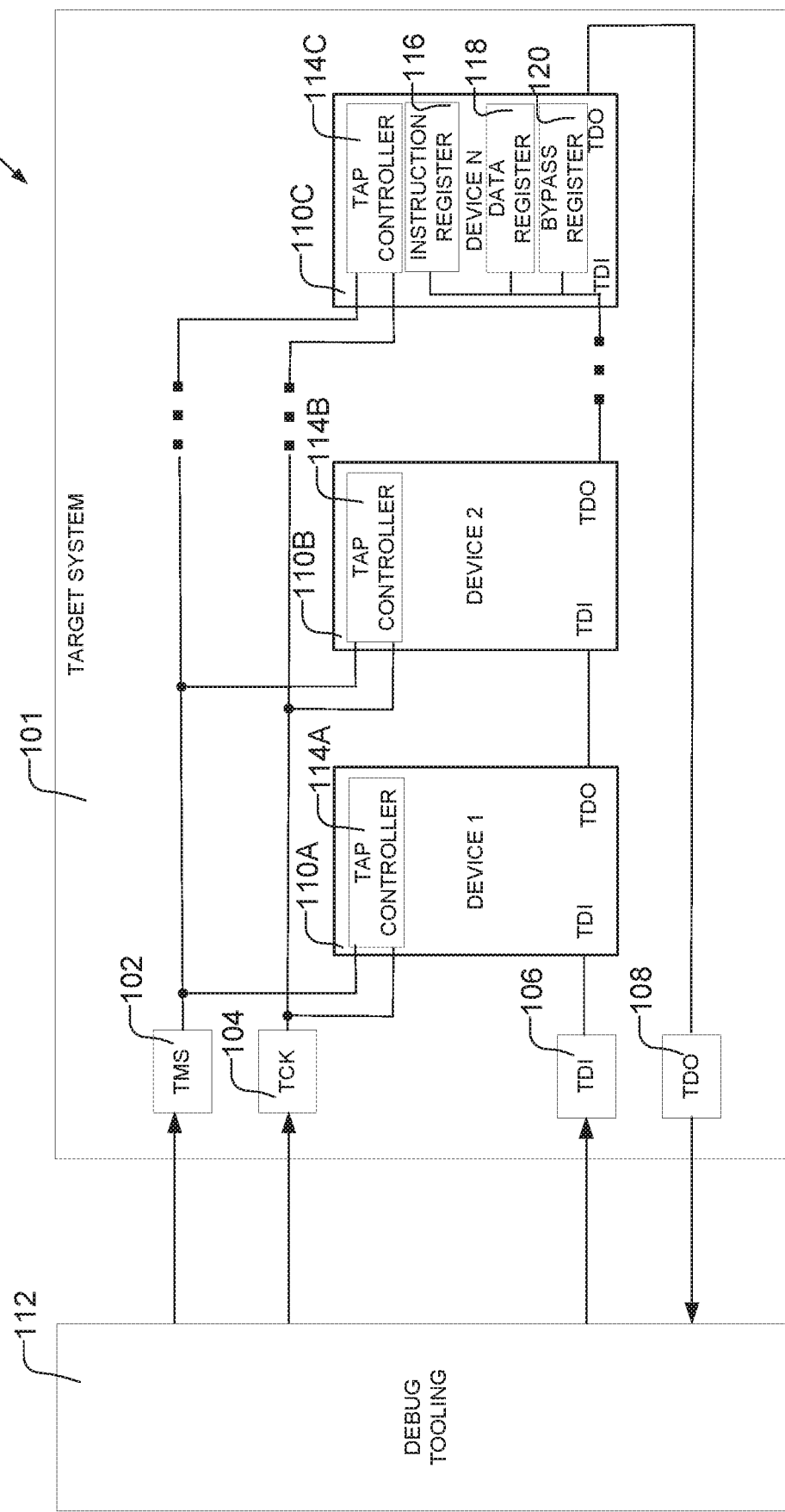
FIG. 1 illustrates, by way of example, a diagram of an embodiment of a system that includes a JTAG interface.

JTAG data can be packetized and transported over various protocols. The packetization can help enable better transport mechanisms for JTAG scan data. When packetized, raw JTAG scan data can be passed where one or more clock cycles of one or more JTAG signals (e.g., test data in (TDI), test mode select (TMS), test data out (TDO), or test reset (TRST)) are represented in a data payload of a packet. These bit-by-bit packet representations can become inefficient, especially for transport protocols with a high latency bus or when requiring interactive monitoring and manipulation, such as through debug tooling. JTAG can be improved from reduced data payload, reduced debug tooling to target system communication, or reduced dependence on debug tooling interaction, such as to help maintain usable bandwidth performance across various transports.

There are existing solutions that packetize JTAG scans and transport them over a different protocol. Some of these solutions use higher bandwidth transports. Some of these solutions perform some level of optimization, such as by encoding a desired next state of a test access port (TAP) controller in a payload of a packet. These solutions can reduce a need for sending a TMS signal and can reduce a size of a data payload.

The optimization to encode the desired next state can help to relieve some of the data payload traffic. The encoding optimization does not resolve the need for some operations to have short transmission distances, such as RMW and polling loops, such as with a bit field comparison. Short transmission distances can help in making a decision based on the returned data or to detect and recover from data issues or errors. Longer transmission distances between debug tooling and a target system can be a problem when using higher latency or lower bandwidth connections between the debug tooling and a target system (e.g., a device under test (DUT)).

Target systems are becoming physically smaller and may not have the luxury of low latency, high bandwidth transports. Sometimes, a physical distance between the target system and the debug tooling is large, such as can include a distance between rooms, buildings, or even countries, which adds latency. Encoding the TAP state and providing the encoded TAP state data in a payload of a packet does not alone solve these problems. The problems can be overcome with other types of optimizations. Embodiments herein go beyond these traditional encodings of JTAG TAP state to solve latency problems with JTAG systems.

In one or more embodiments, a device with a JTAG interface can include circuitry to perform some of the higher-level operations, such as polling and RMW operations. This circuitry offloads some of the operations from the debug tooling and moves the operations to the target system. The operations performed by the circuitry can be selected to reduce a number of communications between the target system and the debug tooling. The reduction in communications between the debug tooling and the target system can reduce an amount of time for a JTAG operation, such as from a time a JTAG command is sent to a time a result of the JTAG command is returned to the debug tooling. Embodiments result in the target being more autonomous in performing these operations, reducing the amount of data being transmitted between the debug tooling and target system, and less time consumed in completing at least some JTAG operations.

A JTAG interface is a specific interface added to a device. There are multiple versions of JTAG interfaces. Some JTAG interfaces include two pins, other JTAG interfaces include four pins, and yet other JTAG interfaces includes five pins. The four and five pin JTAG interfaces allow for daisy-chaining JTAG lines if certain conditions are met. The two pin JTAG interface can help debug and/or control chips coupled in a star topology. Using any of the JTAG interfaces a JTAG port can provide access to electrical signals of one or more devices. Embodiments are described with regard to four pin JTAG interfaces, but are equally applicable to two, five, and other pin count JTAG configurations.

FIG. 1 illustrates, by way of example, a diagram of an embodiment of a system 100 that includes a JTAG interface. The embodiment illustrated is an example of a four pin JTAG interface. The system 100 as illustrated includes JTAG pins including a TMS pin 102, TCK pin 104, TDI pin 106, and TDO pin 108, provided to/from devices 110A, 110B, and 110C. While three devices 110A-110C are illustrated, JTAG can interface with one or more devices. A five pin JTAG interface further includes a TRST pin. The TRST pin is a reset pin. In JTAG configurations that do not include a TRST pin, TCK or TMS may be asserted in a specific pattern to reset one or more of the devices 110A-110C.

Data on the TMS pin 102 and the TCK pin 104 determines a next state of a TAP controller 114A, 114B, or 114C. The TAP controller 114A-114C performs a device reset, accesses an instruction register 116, or accesses data from a data register 118 selected by an instruction register 116. Operations are performed by asserting signals on the TMS pin 102 and the TCK pin 104 to put the TAP controller 114A-114C in a state to perform the operations. The IEEE 1149 standard specifies 16 states which the TAP controller 114A-114C can transition to/from. The 16 states are as follows: reset, run-test/idle, select data register (DR) scan, capture data register (DR) data, shift DR data, exit DR, pause DR, second exit of DR, update DR, select instruction register (IR) scan, capture IR data, shift IR data, exit IR, pause IR, second exit of IR, and update IR. Operations, at a higher level, can include reading a device identification, sample an input pin (as detailed in an IR instruction), drive an output pin (as detailed in an IR instruction), make a device perform an operation (as detailed in an IR instruction), and bypass, such as to shorten a chain of devices, such as using a bypass register 120.

All TAP controllers 114A-114C are in a same state. The state of the TAP controllers 114A-114C change on JTAG clock (TCK pin 104) signal transitions. Of the sixteen states, there are six "stable states" and ten other states. In the stable states, maintaining a same signal on the TMS pin 102 prevents the state from changing. In other states, an edge of a signal on the TCK pin 104 changes the state regardless of whether the signal on the TMS pin 102 changes or remains the same. In embodiments that include a TRST pin, asserting a signal on the TRST pin forces envy in a stable state.

More details regarding operations of the TAP controller 114A-114C and transitions between states of the TAP controller 114A-114C are provided in the IEEE 1149 standard. The IEEE 1149 standard is incorporated herein by reference in its entirety.

The TCK pin 104 provides a JTAG clock signal. One bit of data is provided from the TDI pin 106, TDO pin 108, and TMS pin 102 on a JTAG clock edge. The JTAG clock generally operates at a clock speed equal to, or less than, a slowest clock speed of the devices 110A-110C.

The debug tooling communicates with the devices 110A-110C (more specifically, TAP controller 114A-114C of the device 110A-110C), by altering signals carried on the TMS pin 102 and TDI pin 106 along with the JTAG clock on the TCK pin 104. Results are read through the TDO pin 108.

The JTAG interface can include one or more of an instruction register 116, data register 118, and bypass register 120 for each TAP controller 114A-114C. Data can be shifted into/out of the instruction register 116, data register 118, or bypass register 120 in respective JTAG states. Data can be shifted into/out of the instruction register 116, data register 118, or bypass register 120 bit-by-bit.

Generally, using a JTAG interface includes reading and writing instructions and their associated data registers. Sometimes using the JTAG interface includes performing one or more test cycles. The instructions and data registers affect one or more portions of the devices 110A-110C that are generally not operating using JTAG. Devices 110A-110C can be switched into or out of a scan chain, such as by performing a Zero Bit Scan (ZBS) sequence, such as defined in IEEE 1149.7.

In operation, debug tooling 112 provides signals that drive pins of the JTAG interface. The debug tooling 112 drives the TMS pin 102, TCK pin 104, and TDI pin 106. The output of the JTAG interface is provided on the TDO pin 108. The debug tooling 112 receives the output from the TDO pin 108.

Figure 2:
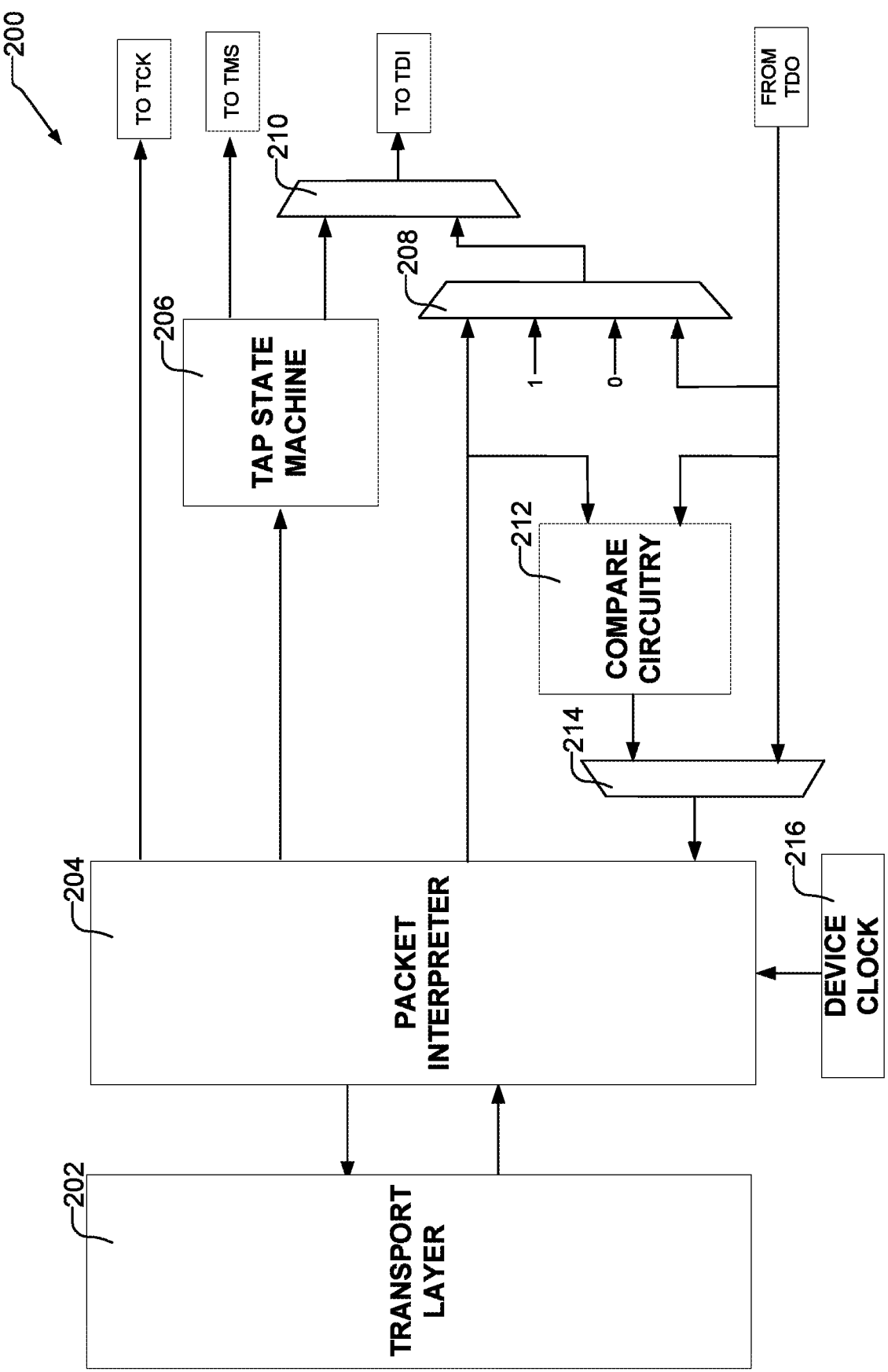
FIG. 2 illustrates, by way of example, a diagram of an embodiment of JTAG interface circuitry for improving JTAG operations.

FIG. 2 illustrates, by way of example, a diagram of an embodiment of JTAG interface circuitry 200 for improving JTAG operations. In one or more embodiments, the JTAG interface circuitry 200 can be included in the target system 101, such as between the debug tooling 112 and a JTAG port of the target system 101. In one or more embodiments, the JTAG interface circuitry 200 can be included in one or more of the devices 110A-110C. The JTAG port includes one or more of the JTAG pins, such as the TMS pin 102, the TCK pin 104, the TDI pin 106, or the TDO pin 108, and the TRST pin in embodiments that include such a pin. The JTAG interface circuitry 200 as illustrated includes transport layer circuitry 202, packet interpreter circuitry 204, TAP state machine 206, multiplexers 208, 210, and 214, compare circuitry 212, and a device clock 216. The JTAG interface circuitry 200 interfaces with the JTAG port.

The transport layer circuitry 202 can provide data from the debug tooling 112 to the target system. The transport layer circuitry 202 can implement a serial or parallel communication protocol. The transport layer circuitry 202 can implement Ethernet, peripheral component interconnect (PCI), universal serial bus (USB), or other communication protocol. The transport layer circuitry 202 receives output data from the packet interpreter circuitry 204. The transport layer circuitry 202 provides the output data to the debug tooling 112. The transport layer circuitry 202 provides data from the debug tooling 112 to the packet interpreter circuitry 204. The data from the debug tooling 112 can be used by the packet interpreter circuitry 204 to drive one or more of the pins of the JTAG port.

Figure 3:
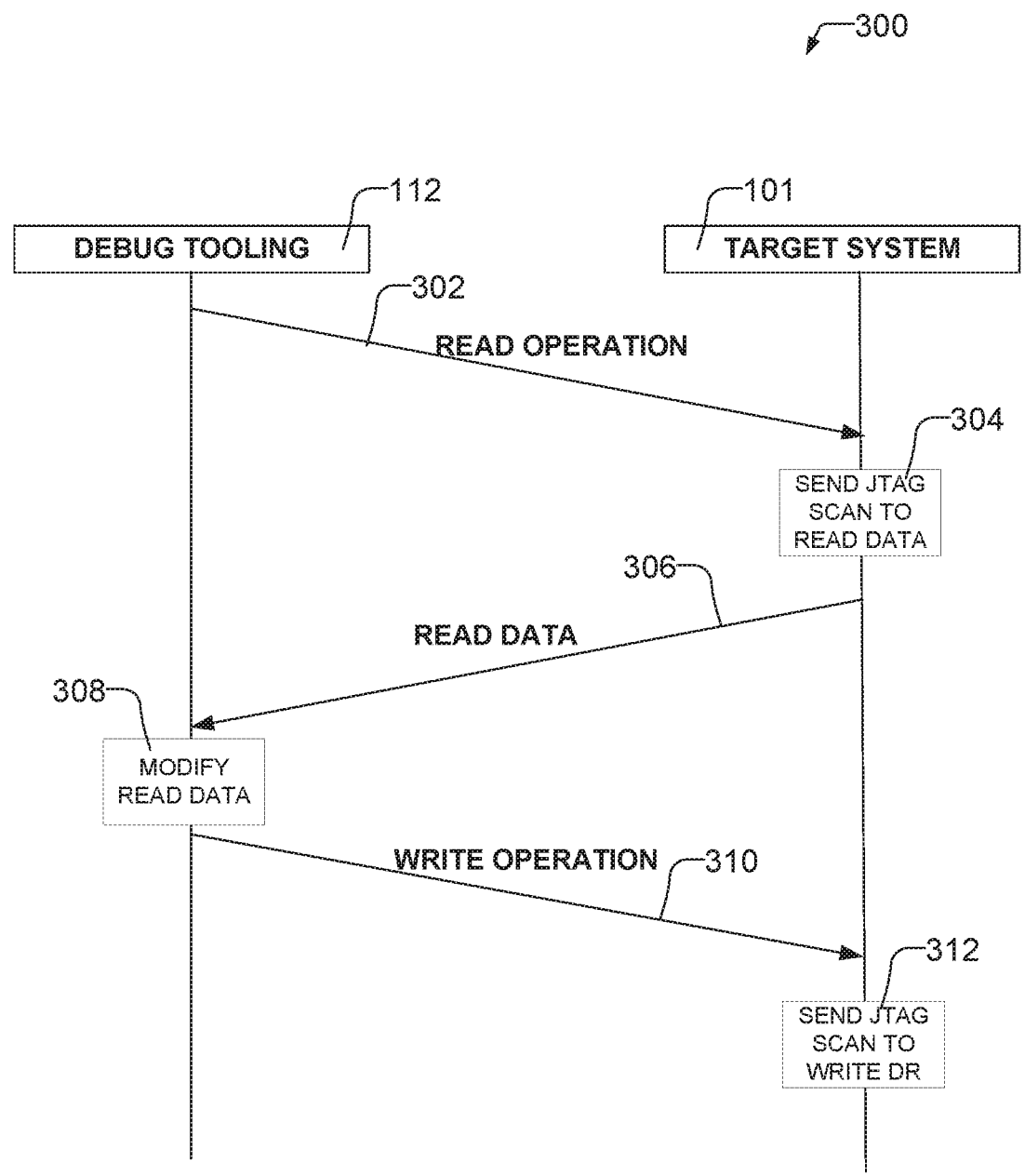
FIG. 3 illustrates, by way of example, a flowchart of an embodiment of communications and operations of the debug tooling and the target system in performing a read-modify-write (RMW) operation without embodiments discussed herein.
Figure 4:
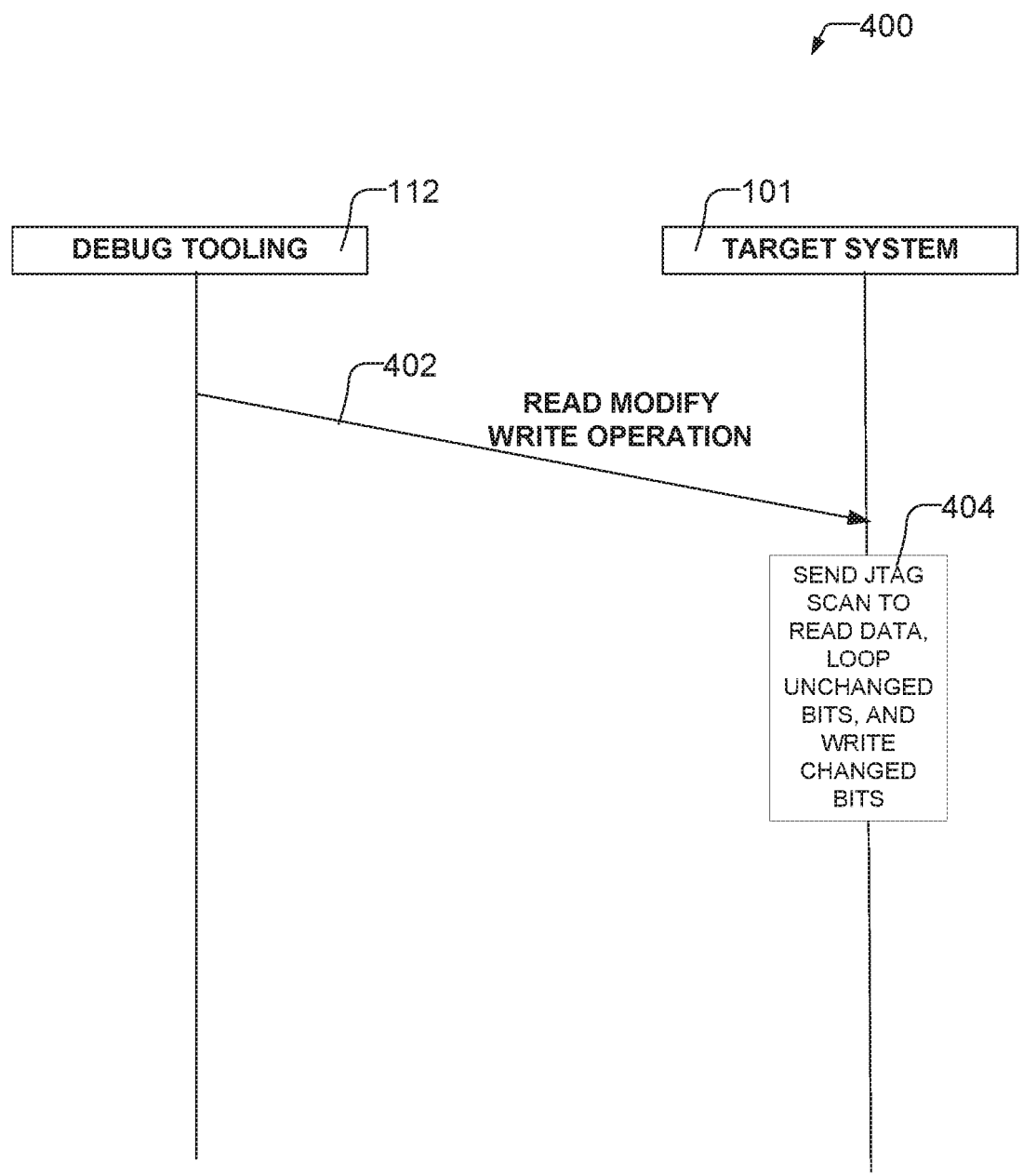
FIG. 4 illustrates, by way of example, a flowchart of an embodiment of communications and operations the debug tooling and the target system in performing an RMW operation with embodiments discussed herein.
Figure 5:
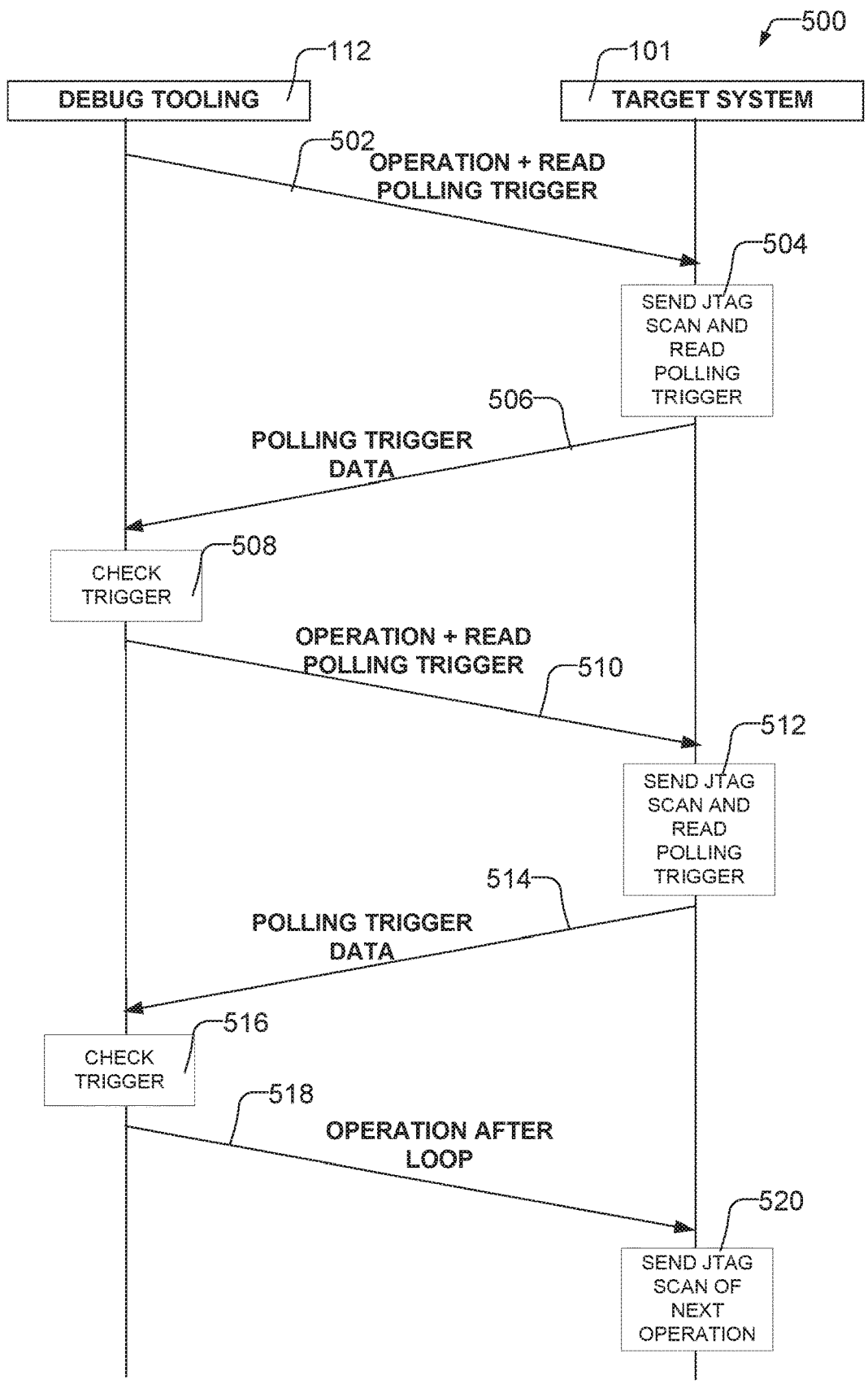
FIG. 5 illustrates, by way of example, a flowchart of an embodiment of communications and operations of the debug tooling and the target system in performing a polling loop operation without embodiments discussed herein.
Figure 6:
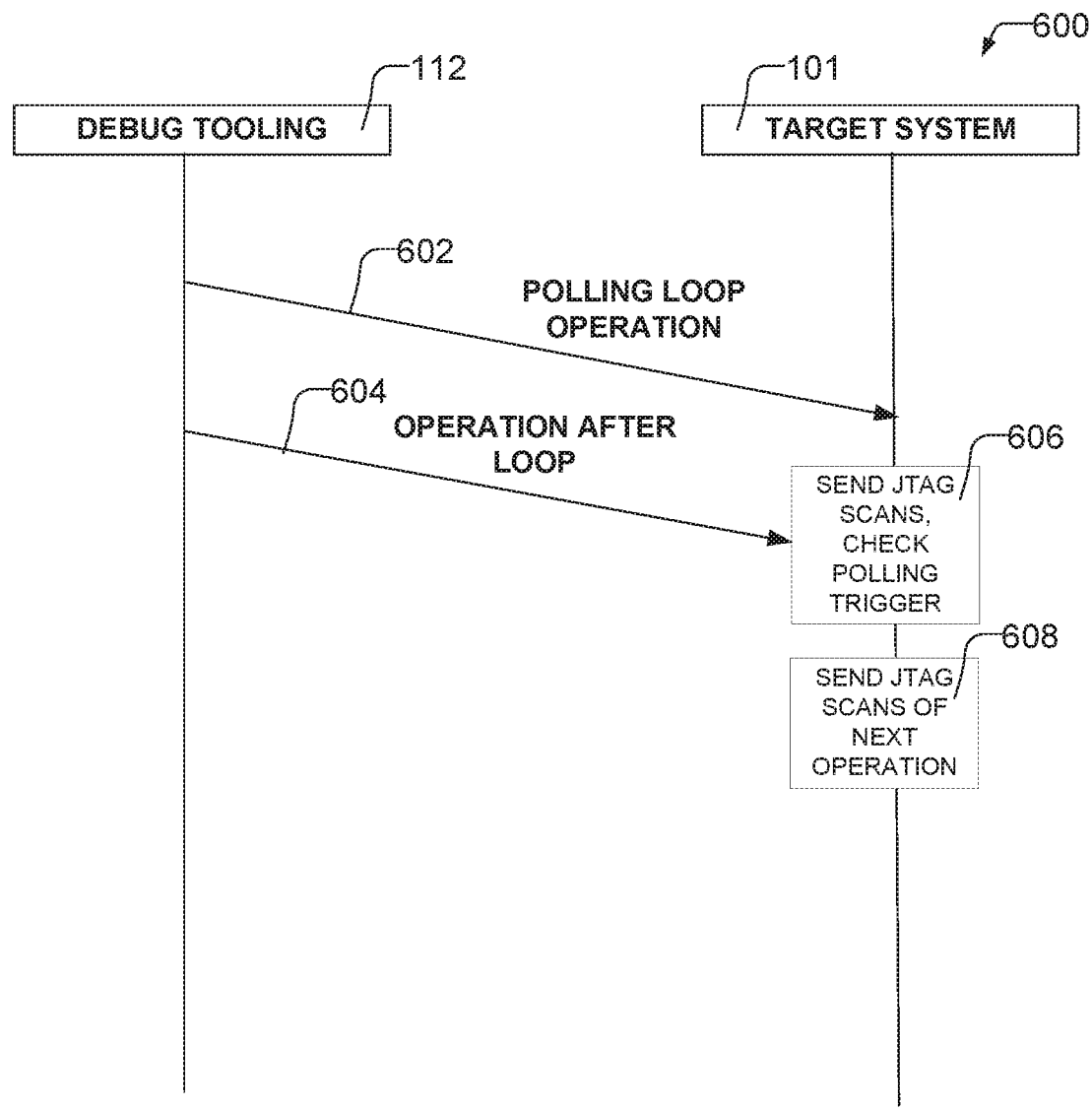
FIG. 6 illustrates, by way of example, a flowchart of an embodiment of communications and operations of the debug tooling and the target system in performing a polling loop operation with embodiments discussed herein.
Figure 7:
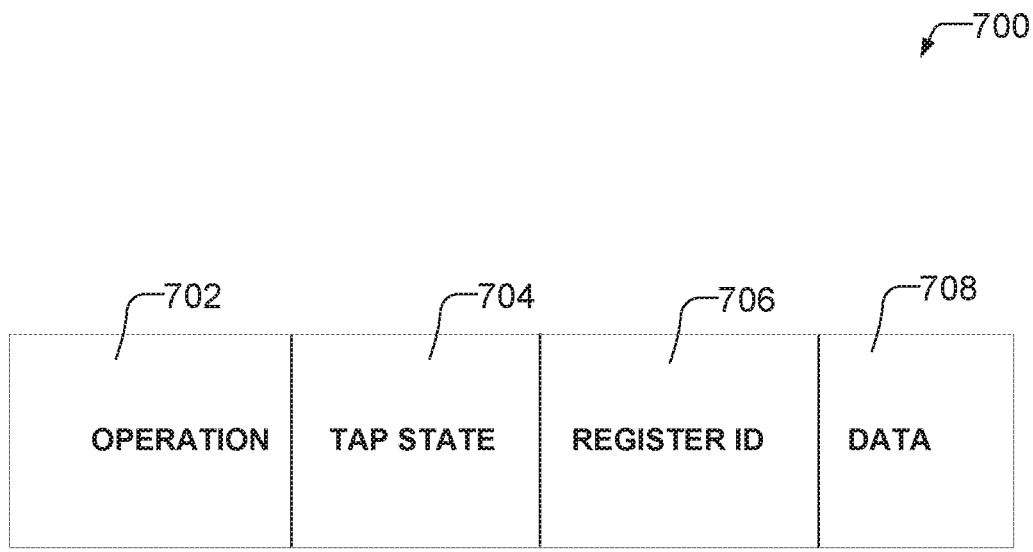
FIG. 7 illustrates, by way of example, a diagram of an embodiment of a packet structure for a packet from debug tooling for a target system.

The packet interpreter circuitry 204 can provide an intermediate control mechanism for the JTAG port. The packet interpreter circuitry 204 receives packets of data from the transport layer circuitry 202. The packets of data specify one or more operations to be performed on the target system 101 through the JTAG port. The packets of data can specify data to be written to or read from the target system 101. The packets of data can specify a pin of the device to be driven (or floated) or a voltage value to which to drive the pin. The packets, for example, can indicate that an RMW operation or a polling loop operation is to be performed. FIGS. 3-4 describe an RMW operation in more detail. FIGS. 5-6 describe a polling operation in more detail. FIG. 7 illustrates an example packet that can be provided to the packet interpreter circuitry 204 by the transport layer circuitry 202.

The packet interpreter circuitry 204 can include circuitry, such as one or more resistors, transistors, capacitors, inductors, diodes, logic gates (e.g., AND, OR, NAND, NOR, XOR, negate, or other logic gate), multiplexers, switches, regulators (e.g., voltage or current regulators), amplifiers, memory devices (e.g., a hardware queue, random access memory (RAM), read only memory (ROM), flash memory, or the like), an oscillator, analog to digital converters, digital to analog converters, or the like. The circuitry can be configured to decode data from the transport layer, determine operations to be performed based on the decoded data, and assert signals to control the TAP state machine 206, TCK pin 104, TMS pin 102, TDI pin 106, the multiplexers 208, 210, or 214, or the like. The circuitry can be configured as a state machine. In one or more embodiments, the circuitry can include a microcontroller, or the like, that can be programmed to carry out the operations of the packet interpreter circuitry 204.

The TAP state machine 206 keeps track of a current state of the TAP controller 114A-114C and possible next states of the TAP controller 114A-114C. The TAP state machine 206 can include a lookup table (LUT) or a hardware state machine, such as can include circuitry discussed elsewhere. Using the TAP state machine 206, the packet interpreter circuitry 204 can transition the TAP controller 114A-114C to any state. The TAP state machine 206 can define transitions between states and a signal value to be provided on the TMS pin 102 that causes the TAP to follow the transition. The TAP state machine 206 can produce a signal to drive the TMS pin 102, such as to cause the TAP to enter a desired state. The TAP state machine 206 can provide a signal to the multiplexer 210, such as can be provided as a signal to drive the TDI pin 106.

The multiplexers 208, 210, and 214 include a select line, such as can be driven by the packet interpreter circuitry 204. The select line is not illustrated so as to not obscure the view of the interconnects in FIG. 2. The multiplexer 208 receives a signal from the packet interpreter circuitry 204, a signal that is driven high (e.g., "1"), signal that is driven low (e.g., "0"), and a feedback of a signal from the TDO pin 108. The multiplexer 208 produces a bit value that is provided to the multiplexer 210. The multiplexer 210 provides a signal that drives the TDI pin 106. The low and high signals can be used for padding or buffering data in a register.

The compare circuitry 212 includes a comparator, or similar circuitry, that can compare a signal provided from the packet interpreter circuitry 204 to a signal on the TDO pin 108. The compare circuitry 212 can produce a signal that indicates whether the signal from the packet interpreter circuitry 204 matches the signal on the TDO pin 108. The multiplexer 214 provides either the output of the compare circuitry 212 or the signal on the TDO pin 108 to the packet interpreter circuitry 204.

The packet interpreter circuitry 204 can be driven by a device clock 216 of the target system 101. The packet interpreter circuitry 204 can produce a signal to drive the JTAG clock provided on the TCK pin 104. The packet interpreter circuitry 204 cycles through operations for carrying out instructions provided on the transport layer circuitry 202.

Using the circuitry 200, instead of packetizing each bit of the JTAG port signals, an optimized representation can be used. This optimized representation can compress JTAG clock cycles by passing the next states of the TAP controller 114A-114C instead of bit representation of each clock cycle, but can reduce debug tooling 112 to target system 101 interactions by locally executing operations, such as RMW and bit field comparisons within the target system 101. These optimizations remove some debug tooling 112 communication and decoding/interacting on lower-level JTAG operations and focus communication and interactions around higher-level operations. These efficiencies are realized, at least in part, by processing certain data patterns local to the JTAG/TAP network, such as in the circuitry 200, in order to reduce the amount of data being sent between the debug tooling 112 and the target system 101.

The optimized representation of a JTAG scan can increase, in some embodiments by orders of magnitude, the JTAG scan efficiency. A JTAG scan includes a plurality of JTAG operations from transitioning out of an idle state until transitioning back to an idle state. In some embodiments, the JTAG scan can be improved by reducing a number of bits it takes to progress through the TAP controller 114A-114C states. In some embodiments, the amount of data sent from the debug tooling 112 to the target system 101, for certain operations (e.g., RMW operations, or polling loop operations), can be reduced. These improvements can affect the efficiency of the transport protocol being used for the packetization (e.g., using the transport layer circuitry 202). Embodiments can provide for improved use of lower speed or higher latency buses, among other buses. Improvements can be realized by locally handling operations, such as in the circuitry 200, such as RMW and bit field comparisons, instead of sending traffic back to the debug tooling 112 to perform the operations which may occur the additional latency penalties of the transport.

To handle the optimized JTAG operations, the packet interpreter circuitry 204 or other circuitry can be added to the target system 101. Traditionally, the behavior of the interpreter circuitry 204 can be part of the software on the debug tooling 112. In embodiments, the circuitry 200 is on the target system 101, such as to shift the point where the debug tooling 112 and target system 101 communicate. By moving this behavior from the debug tooling 112 to the target system 101, the debug tooling 112 can communicate less data to or less often with the target system 101.

The desired JTAG operations from the debug tooling 112 are sent over the transport layer circuitry 202 to the target system 101. The transport layer circuitry 202 provides data payloads to the packet interpreter circuitry 204. The packet interpreter circuitry 204 can decode the JTAG operations encoded in the data payloads.

The packet interpreter circuitry 204 can interact with circuitry between itself and the JTAG/TAP controller network, such as can be on-die, implemented in FPGA, software, or the like. This circuitry, including the TAP state machine 206, can handle the TAP state progressions and polling operations.

The data payloads sent to the packet interpreter circuitry 204 can include data that indicates optimized operations, such as polling and RMW operations, such as to reduce a total amount of data being transmitted between the debug tooling 112 and target system 101. Besides reducing the amount of data, the circuitry 200 can reduce the number of actual transactions between the target system 101 and the debug tooling 112. The reduced number of transactions helps reduce the amount of time it takes to execute a particular set of operations. This is at least in part because each transaction can incur an amount of latency at the transport layer circuitry 202. The reduction of the number of transactions can be based on being able to do polling and RMW operations, for example, locally on the target without further interaction with the debug tooling 112.

To handle the commands of the packet locally on the target system 101, the target system 101 can include data path multiplexing (e.g., the multiplexers 208, 210, or 214). The data path multiplexing can handle various different data shifts for commands or operations of commands, such as padding (e.g., shift "0" or "1" to the TDI pin 106) and RMW operations (where a signal on the TDO pin 108 can be looped back to the TDI pin 106 for the unmodified bits), as well as JTAG clock generation, delay injection, triggering, and local decision making.

The circuitry 200 can be used for controlling and interpreting results of the JTAG operations. The packet interpreter circuitry 204 can be configured to properly sequence other circuitry and the JTAG circuitry to create the desired data scans of the JTAG/TAP network. The circuitry 200 can include buffering circuitry, such as to allow a domain crossing between the transport protocol implemented by the transport layer circuitry 202 and the JTAG/TAP network. The buffer circuitry can allow for differences in clocks, bandwidths, or latencies.

When an RMW operation is performed on prior JTAG systems, a read of a data register is followed by a separate write of the data register. In performing the RMW operation, the read data is read from the target system 101, provided to the to the debug tooling 112, and write data from the debug tooling 112 is written back to the target system 101. The transporting of data back and forth between the target system 101 and the debug tooling 112 can experience high latencies, thus increasing the amount of time it would take to execute the RMW operation. This flow is shown in FIG. 3.

FIG. 3 illustrates, by way of example, a flowchart of an embodiment of communications and operations 300 of the debug tooling 112 and the target system 101 in performing an RMW operation without using embodiments discussed herein. The communications and operations 300 include a read operation communication 302 from the debug tooling 112 to the target system 101. The target system 101 can read data from a data register (DR) at operation 304. The target system 101 can provide a communication 306 including the data read at operation 304 to the debug tooling 112. The debug tooling 112 can modify the read data at operation 308. The debug tooling 112 can provide a write operation communication 310 to the target system 101. At operation 312, the target system can write the data from write operation communication 310 in the DR.

FIG. 4 illustrates, by way of example, a flowchart of an embodiment of communications and operations 400 of the debug tooling 112 and the target system 101 in performing an RMW operation using embodiments discussed herein. The communications and operations 400 include an RMW operation communication 402 from the debug tooling 112 to the target system 101. The RMW operation communication 402 can be provided to the packet interpreter circuitry 204. The RMW operation communication 402 can include data regarding bits to modify and data indicating a read write modify operation is to be performed. The command and data can be provided to the target system 101 in a single packet or a single transaction.

The communications and operations 400 can improve upon the communications and operations 300, such as by eliminating the latencies incurred by read data communication 306 and the write operation communication 310. The target system 101, through the packet interpreter circuitry 204 or other circuitry, such as that illustrated in FIG. 2, can decode the RMW command of the RMW operation communication 402. The packet interpreter circuitry 204 can the read and write operations locally, within the target system 101 and without communicating to the debug tooling 112, thus, saving the time it would take to transport the data back and forth between the target system 101 and the debug tooling 112. The amount of data transferred between the debug tooling 112 and the target system 101 is reduced overall, even though the read operation communication 302 is smaller in terms of bit size as compared to the RMW operation communication 402.

Another example improvement that embodiments provide is in performing a polling loop. In a polling loop a bit field compare operation is performed until it matches a specified value or pattern before exiting the loop to execute further instructions (e.g., loop until a condition is met then continue).

FIG. 5 illustrates, by way of example, a flowchart of an embodiment of communications and operations 500 of the debug tooling 112 and the target system 101 in performing a polling loop operation without embodiments discussed herein. The example of FIG. 5 includes a polling operation, such as polling until a condition is met or has timed out. In the polling operation, a comparison is made between data from the TDO pin 108 and other data. When the data from the TDO pin 108 matches other data, the polling loop can be exited. After exiting, another operation can be performed.

The polling begins with the debug tooling 112 providing a polling operation and read polling trigger communication 502 to the target system 101. The target system 101 can perform a JTAG scan and read a register associated with the polling trigger, at operation 504. The polling trigger data can be provided from the target system 101 to the debug tooling 112 in a polling trigger data communication 506. At operation 508, the debug tooling 508 can determine whether a trigger condition is met by comparing whether the polling trigger data provided in the communication 506 matches a desired value or pattern. If the trigger condition is met (the polling trigger data matches the desired value or pattern), the debug tooling 112 can exit the polling loop by providing a next command, such as by performing an operation after loop communication 518. If the trigger condition is not met (the polling trigger data does not match the desired value or pattern), the process can repeat until the polling condition is met or until a specified number of check trigger operations have been performed. The communication 510 can be a repeat of the communication 502. The operation 512 can be a repeat of the operation 504. The communication 514 can be a repeat of the communication 506. The check trigger operation 516 can include the same operation(s) as the check trigger operation 508. After the polling is exited, the target system 101 can perform a next operation 520.

As illustrated in FIG. 5 the debug tooling 112 sends commands to perform the operations for the polling loop, including reading the data register that contains the triggering condition to exit the loop, with the communication 502 or 510. This polling can include several operations, such as communications, compares, issuing commands to JTAG, or the like, and can include providing data to the debug tooling 112 to perform the comparison or checking of the triggering condition. If the condition is not met, the debug tooling 112 can repeat the operation, such as until the triggering condition is met or for only a specified number of trigger condition checks. Once met or the specified number of trigger condition checks have been performed, then the debug tooling 112 can send the subsequent operation to be performed, such as in the communication 518 and at operation 520. This polling loop's execution time can be relatively long, since for each loop the operation can include the latency of sending the looping transactions and return data for the triggering condition.

FIG. 6 illustrates, by way of example, a flowchart of an embodiment of communications and operations 600 of the debug tooling 112 and the target system 101 in performing a polling loop operation using embodiments discussed herein. Instead of proceeding as detailed in FIG. 5, using a target system 101 that included the circuitry 200, transactions can be sent from the debug tooling 112 for the polling loop and the passing conditions in a single communication, such as the polling loop operation communication 602. The packet interpreter circuitry 204, in conjunction with the compare circuitry 212 can read the data and perform the condition check locally on the target system 101, at operation 606. At, after, before, during, or around the time, the loop is executing, the debug tooling 112 can send a subsequent operation 604 to be performed after the condition is met. The subsequent operation 604 can be stored in a local queue of the packet interpreter circuitry 204, such as for when the compare circuitry 212 indicates the condition has been met. The packet interpreter circuitry 204 may clear any queued transactions upon a "timeout" error, such as if the specified number of comparisons have been performed.

The initial transaction of FIG. 6 (e.g., the polling loop operation communication 602) includes more data compared to an initial transaction of prior methods (e.g., the operation and read polling trigger communication 502). An improvement can be realized over the entire polling process from polling initiation to exiting the polling loop or executing a next operation. The embodiment described in FIG. 6 does not require the loop to be resent from the debug tooling 112 to the target system 101, and does not require the triggering condition data be sent back to the debug tooling 112 from the target system 101, as are required by the embodiment of FIG. 5. Also, in FIG. 6, there are no communication latencies beyond the initial transaction, thus reducing overall time of performing the polling loop.

FIG. 7 illustrates, by way of example, a diagram of an embodiment of a packet structure 700 for a packet from the debug tooling 112 to the target system 101. The packet structure 700 as illustrated includes an operation field 702, a TAP state field 704, a register identification field 706, and a data field 708. The operation field 702 can include data indicating a high-level operation to be performed using low-level operations of the packet interpreter circuitry 204. The operation in the operation field 702 can include, for example, data indicating a shift TDI data operation, shift TDI data with capturing TDO data, an RMW command, bit field compare command, polling (until a condition is met or timed out) command, or other optimized operation command.

The TAP state field 704 can include data indicating a desired JTG scan or specific state of the TAP controller 114A-114C. The TAP state machine 206 can determine the transitions required to place the TAP controller 114A-114C in the TAP state indicated in the TAP state field 704. The TAP state machine 206 can translate the desired next TAP state into various TCK and TMS sequences that follow the IEEE 1149 defined state machine progressions to advance between states. These commands can instruct the packet interpreter circuitry 204 to perform additional operations or to use other circuitry 200, besides the packet interpreter circuitry 204.

The register ID field 706 identifies a destination register associated with the operation detailed in the operation field 702. The register ID field 706 can include data identifying a data register, instruction register, or bypass register, for example.

The data field 708 of the packet 700 can include TDI data, compare data, mask (for RMW operations), or a combination thereof.

Figure 8:
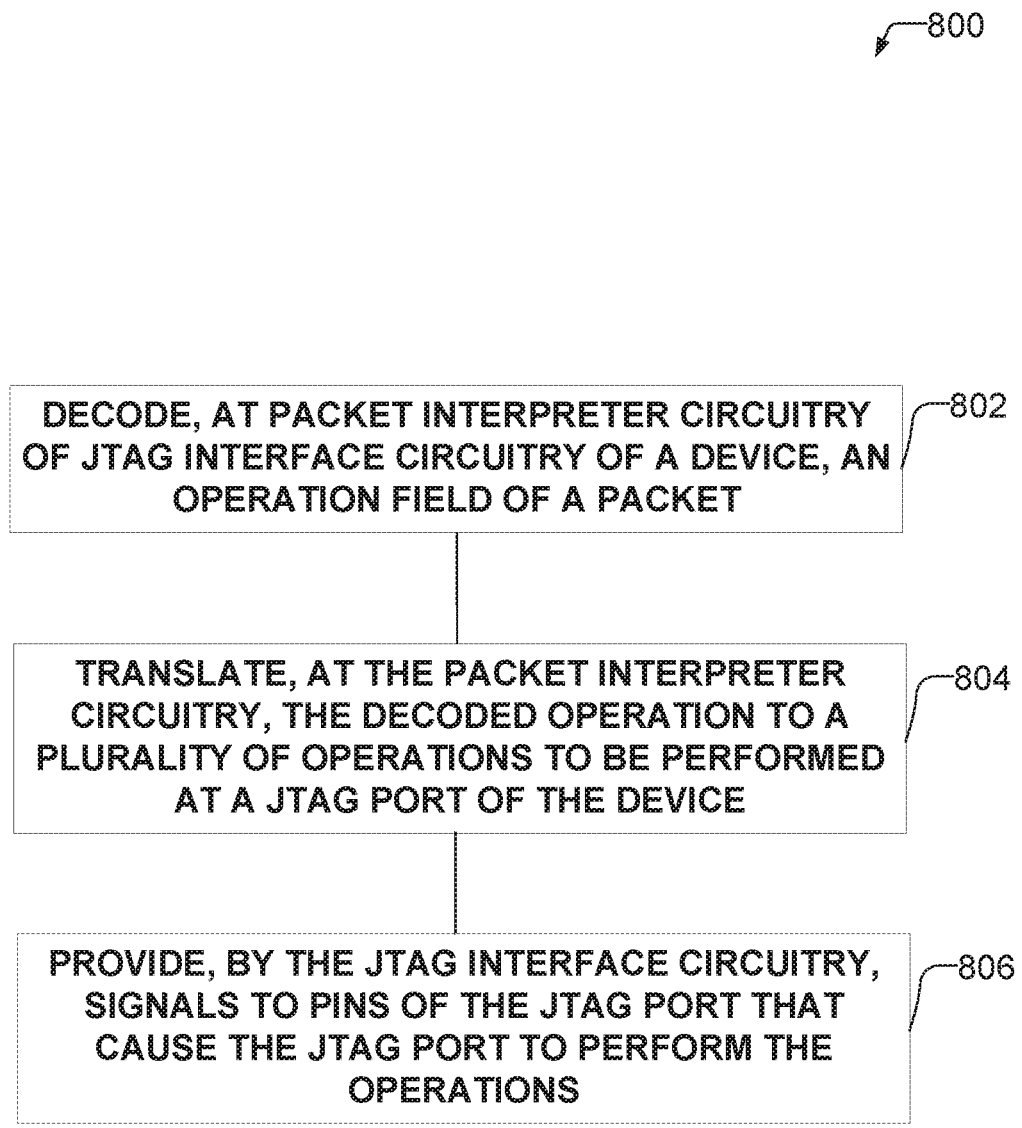
FIG. 8 illustrates, by way of example, a diagram of an embodiment of a method for increasing efficiency of JTAG communications or operations.

FIG. 8 illustrates, by way of example, a diagram of an embodiment of a method 800 for increasing an efficiency of JTAG operations or communications. The method 800 as illustrated includes: decoding, at packet interpreter circuitry of Joint Test Action Group (JTAG) interface circuitry of a device, an operation field of a packet, at operation 802; translating, at the packet interpreter circuitry, the decoded operation to a plurality of operations to be performed at a JTAG port of the device, at operation 804; and providing, by the JTAG interface circuitry, signals to pins of the JTAG port that cause the JTAG port to perform the operations, at operation 806.

The method 800 can further include comparing, by compare circuitry of the JTAG interface circuitry, a first value from the packet interpreter circuitry to a second value from an output pin of the JTAG port. The method 800 can further include producing a first output in response to a determination that the first and second values match. The method 800 can further include producing a second output in response to a determination that the first and second values are different. The method 800 can further include determining, at Test Access Port (TAP) state machine circuitry of the JTAG interface circuitry, a sequence of values to be provided on a Test Mode Select (TMS) pin to place the JTAG port in a state specified by the packet interpreter circuitry.

The packet can include an operation field that indicates a read-modify-write operation is to be performed, a register identification of a register to be read, and data to be stored in the register to be read. The method 800 can further include issuing a command to the TAP state machine circuitry to place the JTAG port in a shift data state, issuing a command to the TAP state machine to shift one or more bits out of the register to be read, and issue a command to the TAP state machine to shift one or more bits into the register to be read.

The packet can include an operation field that indicates a polling loop operation is to be performed and a condition that, when met, will finish the polling loop. The method 800 can further include issuing a command to the TAP state machine circuitry to place the JTAG port in a shift data state, and issue a command to the TAP state machine to shift one or more bits out of the register to be read. The method 800 can further include comparing, at compare circuitry of the JTAG interface circuitry, the condition with the one or more bits shifted out of the register. The method 800 can further include, in response to receiving the first output, provide a subsequent command to the TAP state machine circuitry, and in response to receiving the second output, repeat issuance of the command to the TAP state machine circuitry to place the JTAG port in a shift data state, and the command to the TAP state machine to shift one or more bits out of the register to be read until one of (1) the first output is received, or (2) a specified number of comparisons have been performed by the compare circuitry. The method 800 can further include, while the JTAG port is performing commands associated with the polling loop operation providing, by transport layer circuitry coupled between debug tooling and the JTAG interface circuitry, a second packet including data indicating an operation to be performed after the polling loop exits. The method 800 can further include storing, by the packet interpreter circuitry, the data from the second packet in a memory local to the transport layer circuitry. The method 800 can further include flushing data from the memory in response to the specified number of comparisons being performed.

Figure 9:
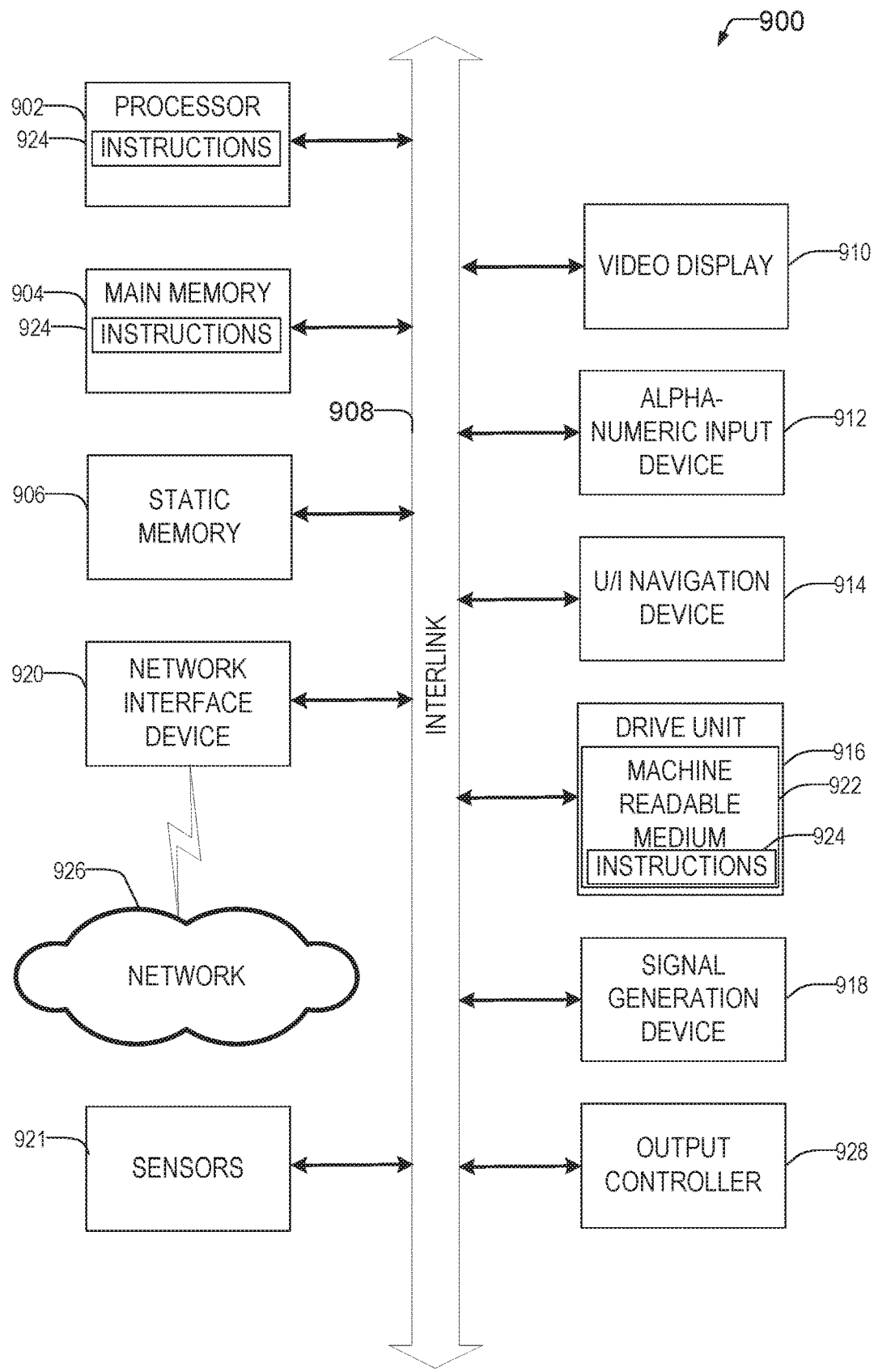
FIG. 9 illustrates a block diagram of an example machine upon which any one or more of the techniques (e.g., methodologies) discussed herein may perform.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be, or be a part of, a AV, an infrastructure device, a cloud service, a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. For example, machine 900 may be or be part of packet interpreter circuitry 204, debug tooling 112, target system 101, or the device 110A, 110B, or 110C. Machine 900 may be configured to implement a portion of the methods of FIGS. 3-6. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 900 may include a hardware processor 902 (e.g., a central processing unit (CPU), a graphics processing unit (GPU), a hardware processor core, or any combination thereof), a main memory 904 and a static memory 906, some or all of which may communicate with each other via an interlink (e.g., bus) 908. The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit) 916, a signal generation device 918 (e.g., a speaker), a network interface device 920, and one or more sensors 921, such as a global positioning system (GPS) sensor, compass, accelerometer, or other sensor. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute machine readable media.

While the machine readable medium 922 is illustrated as a single medium, the term "machine readable medium" may include a single medium or multiple media (e.g., a centralized or distributed database, and/or associated caches and servers) configured to store the one or more instructions 924.

The term "machine readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media may include non-transitory machine-readable media. In some examples, machine readable media may include machine readable media that is not a transitory propagating signal.

The instructions 924 may further be transmitted or received over a communications network 926 using a transmission medium via the network interface device 920. The machine 900 may communicate with one or more other machines utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 920 may include one or more physical jacks (e.g., Ethernet, coaxial, or phone jacks) or one or more antennas to connect to the communications network 926. In an example, the network interface device 920 may include a plurality of antennas to wirelessly communicate using at least one of single-input multiple-output (SIMO), multiple-input multiple-output (MIMO), or multiple-input single-output (MISO) techniques. In some examples, the network interface device 920 may wirelessly communicate using Multiple User MIMO techniques.

OTHER NOTES AND EXAMPLES

Example 1 is a Joint Test Access Group (JTAG) device comprising a Joint Test Access Group (JTAG) port, transport layer circuitry to provide a communication to and from a debug device, and packet interpreter circuitry communicatively coupled between the JTAG port and the transport layer circuitry, the packet interpreter circuitry to translate data in a packet from the debug device into a sequence of bits to be provided to the JTAG port.

In Example 2, the subject matter of Example 1 includes, compare circuitry to compare a first value from the packet interpreter circuitry to a second value from the JTAG port, produce a first output in response to a determination that the first and second values match, and produce a second output in response to a determination that the first and second values are different.

In Example 3, the subject matter of at least one of Examples 1-2 includes, Test Access Port (TAP) state machine circuitry to determine a sequence of values to be provided on a Test Mode Select (TMS) pin and a Test Data In (TDI) pin to place the JTAG port in a state specified by the packet interpreter circuitry.

In Example 4, the subject matter of at least one of Examples 1-3 includes, wherein the communication is a read-modify-write operation communication that includes data indicating a read write modify operation is to be performed, a register to be read, and data to be stored in the register to be read.

In Example 5, the subject matter of Example 4 includes, wherein the packet interpreter circuitry is further to, in response to the read-modify-write operation communication, issue a command to the TAP state machine to place the JTAG port in a shift data state, issue a command to the TAP state machine to shift one or more bits out of the register to be read, and issue a command to the TAP state machine to shift one or more bits into the register to be read.

In Example 6, the subject matter of at least one of Examples 2-3 includes, wherein the communication is a polling loop operation communication that includes data indicating a polling loop operation is to be performed and a condition that, when met, will finish the polling loop.

In Example 7, the subject matter of Example 6 includes, wherein the packet interpreter circuitry is further to, in response to the polling loop operation communication, issue a command to the TAP state machine to place the JTAG port in a shift data state, and issue a command to the TAP state machine to shift one or more bits out of the register to be read.

In Example 8, the subject matter of Example 7 includes, wherein the compare circuitry is to compare the condition with the one or more bits shifted out of the register.

In Example 9, the subject matter of Example 8 includes, wherein the packet interpreter circuitry is further to, in response to reception of the first output, provide a subsequent command to the TAP state machine circuitry, and in response to reception of the second output, repeat issuance of the command to the TAP state machine to place the JTAG port in a shift data state, and the command to the TAP state machine to shift one or more bits out of the register to be read until one of (1) the first output is received, or (2) a specified number of comparisons have been performed by the compare circuitry.

In Example 10, the subject matter of at least one of Examples 6-9 includes, wherein the transport layer circuitry is to, while the JTAG port is performing commands associated with the polling loop operation, provide a second packet including data indicating an operation to be performed after the polling loop exits.

In Example 11, the subject matter of Example 10 includes, wherein the packet interpreter circuitry is to store the data from the second packet in a memory local to the transport layer circuitry.

In Example 12, the subject matter of Examples 11 includes, wherein the packet interpreter circuitry is to flush data from the memory in response to the specified number of comparisons being performed.

In Example 13, the subject matter of at least one of Examples 1-12 includes, wherein the target system further comprises a multiplexed data path including one or more multiplexers coupled to the packet interpreter circuitry, the TAP state machine circuitry, or the compare circuitry.

In Example 14, the subject matter of Example 13 includes, wherein the multiplexed data path includes one or more first multiplexers to provide a signal to drive the TDI pin of the JTAG port, the one or more first multiplexers to receive a first input from the TAP state machine circuitry, a second input from the packet interpreter circuitry, a third input from a signal driven high, a fourth input from a signal driven low, a fifth input from a signal from a test data out (TDO) pin, and a sixth input from the packet interpreter circuitry to select between the first, second, third, fourth, and fifth inputs.

In Example 15, the subject matter of at least one of Examples 13-14 includes, wherein the multiplexed data path includes a second multiplexer to provide output data to the packet interpreter circuitry, the second multiplexer to receive a first input from a test data out (TDO) pin of the JTAG port, a second input from the compare circuitry, and a third input from the packet interpreter circuitry to select between the first and second input.

Example 16 is a method comprising decoding, at packet interpreter circuitry of joint Test Action Group (JTAG) interface circuitry of a device, an operation field of a packet, translating, at the packet interpreter circuitry, the decoded operation to a plurality of operations to be performed at a JTAG port of the device, and providing, by the JTAG interface circuitry, signals to pins of the JTAG port that cause the JTAG port to perform the operations.

In Example 17, the subject matter of Example 16 includes comparing, by compare circuitry of the JTAG interface circuitry, a first value from the packet interpreter circuitry to a second value from an output pin of the JTAG port, producing a first output in response to a determination that the first and second values match, and producing a second output in response to a determination that the first and second values are different.

In Example 18, the subject matter of at least one of Examples 16-17 includes determining, at Test Access Port (TAP) state machine circuitry of the JTAG interface circuitry, a sequence of values to be provided on a Test Mode Select (TMS) pin to place the JTAG port in a state specified by the packet interpreter circuitry.

In Example 19, the subject matter of at least one of Examples 16-18 includes, wherein the packet includes an operation field that indicates a read-modify-write operation is to be performed, a register identification of a register to be read, and data to be stored in the register to be read.

In Example 20, the subject matter of Example 19 includes issuing a command to the TAP state machine circuitry to place the JTAG port in a shift data state, issuing a command to the TAP state machine to shift one or more bits out of the register to be read, and issue a command to the TAP state machine to shift one or more bits into the register to be read.

In Example 21, the subject matter of at least one of Examples 17-18 includes, wherein the packet includes an operation field that indicates a polling loop operation is to be performed and a condition that, when met, will finish the polling loop.

In Example 22, the subject matter of Example 21 includes issuing a command to the TAP state machine circuitry to place the JTAG port in a shift data state, and issue a command to the TAP state machine to shift one or more bits out of the register to be read.

In Example 23, the subject matter of Example 21 includes comparing, at compare circuitry of the JTAG interface circuitry, the condition with the one or more bits shifted out of the register.

In Example 24, the subject matter of Example 23 includes, in response to receiving the first output, provide a subsequent command to the TAP state machine circuitry, and in response to receiving the second output, repeat issuance of the command to the TAP state machine circuitry to place the JTAG port in a shift data state, and the command to the TAP state machine to shift one or more bits out of the register to be read until one of (1) the first output is received, or (2) a specified number of comparisons have been performed by the compare circuitry.

In Example 25, the subject matter of at least one of Examples 23-24 includes, while the JTAG port is performing commands associated with the polling loop operation providing, by transport layer circuitry coupled between debug tooling and the JTAG interface circuitry, a second packet including data indicating an operation to be performed after the polling loop exits.

In Example 26, the subject matter of Example 25 includes, storing, by the packet interpreter circuitry, the data from the second packet in a memory local to the transport layer circuitry.

In Example 27, the subject matter of Example 26 includes flushing data from the memory in response to the specified number of comparisons being performed.

Example 28 is a system including debug tooling to provide packets to a target system; and a target system comprising a Joint Test Access Group (JTAG) port, transport layer circuitry to receive the packet from the debug tooling, packet interpreter circuitry communicatively coupled between the JTAG port and the transport layer circuitry, the packet interpreter circuitry to translate data in the packet from the debug tooling into a sequence of commands and data to be provided to the JTAG port, compare circuitry coupled between the packet interpreter circuitry and the JTAG port, the compare circuitry to compare a first value from the packet interpreter circuitry to a second value from the JTAG port, produce a first output in response to a determination that the first and second values match, and produce a second output in response to a determination that the first and second values are different, and Test Access Port (TAP) state machine circuitry to determine a sequence of values to be provided on a Test Mode Select (TMS) pin and a Test Data In (TDI) pin to place a TAP controller of the JTAG port in a state specified by the packet interpreter circuitry.

In Example 29, the subject matter of Example 28 includes, wherein the target system further comprises a multiplexed data path including one or more multiplexers coupled to the packet interpreter circuitry, the TAP state machine circuitry, or the compare circuitry.

In Example 30, the subject matter of Example 29 includes, wherein the multiplexed data path includes one or more first multiplexers to provide a signal to drive the TDI pin of the JTAG port, the one or more first multiplexers to receive a first input from the TAP state machine circuitry, a second input from the packet interpreter circuitry, a third input from a signal driven high, a fourth input from a signal driven low, a fifth input from a signal from a test data out (TDO) pin, and a sixth input from the packet interpreter circuitry to select between the first, second, third, fourth, and fifth inputs.

In Example 31, the subject matter of Example 30 includes, wherein the multiplexed data path includes a second multiplexer to provide output data to the packet interpreter circuitry, the second multiplexer to receive a first input from a test data out (TDO) pin of the JTAG port, a second input from the compare circuitry, and a third input from the packet interpreter circuitry to select between the first and second input.

In Example 32, the subject matter of at least one of Examples 28-31 includes, wherein the packet is a read-modify-write operation packet that includes data indicating a read write modify operation is to be performed, a register to be read, and data to be stored in the register to be read.

In Example 33, the subject matter of Example 32 includes, wherein the packet interpreter circuitry is further to, in response to the read-modify-write operation packet, issue a command to the TAP state machine to place the JTAG port in a shift data state, issue a command to the TAP state machine to shift one or more bits out of the register to be read, and issue a command to the TAP state machine to shift one or more bits into the register to be read.

In Example 34, the subject matter of at least one of Examples 28-33 includes, wherein the packet is a polling loop operation packet that includes data indicating a polling loop operation is to be performed and a condition that, when met, will finish the polling loop.

In Example 35, the subject matter of Example 34 includes, wherein the packet interpreter circuitry is further to, in response to the polling loop operation packet, issue a command to the TAP state machine to place the JTAG port in a shift data state, and issue a command to the TAP state machine to shift one or more bits out of the register to be read.

In Example 36, the subject matter of Example 35 includes, wherein the compare circuitry is to compare the condition with the one or more bits shifted out of the register.

In Example 37, the subject matter of Example 36 includes, wherein the packet interpreter circuitry is further to, in response to reception of the first output, provide a subsequent command to the TAP state machine circuitry, and in response to reception of the second output, repeat issuance of the command to the TAP state machine to place the JTAG port in a shift data state, and the command to the TAP state machine to shift one or more bits out of the register to be read until one of (1) the first output is received, or (2) a specified number of comparisons have been performed by the compare circuitry.

In Example 38, the subject matter of at least one of Examples 28-37 includes, wherein the transport layer circuitry is to, while the JTAG port is performing commands associated with the polling loop operation, provide a second packet including data indicating an operation to be performed after the polling loop exits.

In Example 39, the subject matter of Example 38 includes, wherein the packet interpreter circuitry is to store the data from the second packet in a memory local to the transport layer circuitry.

In Example 40, the subject matter of Example 39 includes, wherein the packet interpreter circuitry is to flush data from the memory in response to the specified number of comparisons being performed.

Example 41 is an apparatus comprising means to implement of any of Examples 1-40.

Example 42 is a system to implement of any of Examples 1-40.

Example 43 is a method to implement of any of Examples 1-40.

Example 44 is a non-transitory machine-readable medium including instructions that, when executed by a machine, configure the machine to perform a method of any of Examples 1-40.

What is claimed is:

1. A device comprising:
    a boundary scan port;
    transport layer circuitry to provide a communication to and from a debug device; and
    packet interpreter circuitry communicatively coupled between the boundary scan port and the transport layer circuitry, the packet interpreter circuitry to translate data in a packet from the debug device into a sequence of bits to be provided to the boundary scan port.

2. The device of claim 1, further comprising:
    compare circuitry to compare a first value from the packet interpreter circuitry to a second value from the boundary scan port, produce a first output in response to a determination that the first and second values match, and produce a second output in response to a determination that the first and second values are different.

3. The device of claim 2, wherein the communication is a polling loop operation communication that includes data indicating a polling loop operation is to be performed and a condition that, when met, will finish the polling loop.

4. The devices of claim 3, wherein the packet interpreter circuitry is further to, in response to the polling loop operation communication, issue a command to the TAP state machine to place the boundary scan port in a shift data state, and issue a command to the TAP state machine to shift one or more bits out of the register to be read.

5. The device of claim 4, wherein the compare circuitry is to compare the condition with the one or more bits shifted out of the register.

6. The device of claim 5, wherein the packet interpreter circuitry is further to, in response to reception of the first output, provide a subsequent command to the TAP state machine circuitry, and in response to reception of the second output, repeat issuance of the command to the TAP state machine to place the boundary scan port in a shift data state, and the command to the TAP state machine to shift one or more bits out of the register to be read until one of (1) the first output is received, or (2) a specified number of comparisons have been performed by the compare circuitry.

7. The device of claim 3, wherein the transport layer circuitry is to, while the JTAG port is performing commands associated with the polling loop operation, provide a second packet including data indicating an operation to be performed after the polling loop exits.

8. The device of claim 7, wherein the packet interpreter circuitry is to store the data from the second packet in a memory local to the transport layer circuitry.

9. The device of claim 8, wherein the packet interpreter circuitry is to flush data from the memory in response to the specified number of comparisons being performed.

10. The device of claim 1, further comprising:
    Test Access Port (TAP) state machine circuitry to determine a sequence of values to be provided on a Test Mode Select (TMS) pin and a Test Data In (TDI) pin to place the JTAG port in a state specified by the packet interpreter circuitry.

11. The device of claim 1, wherein the communication is a read-modify-write operation communication that includes data indicating a read write modify operation is to be performed, a register to be read, and data to be stored in the register to be read.

12. The device of claim 11, wherein the packet interpreter circuitry is further to, in response to the read-modify-write operation communication, issue a command to the TAP state machine to place the boundary scan port in a shift data state, issue a command to the TAP state machine to shift one or more bits out of the register to be read, and issue a command to the TAP state machine to shift one or more bits into the register to be read.

13. The device of claim 1, wherein the target system further comprises a multiplexed data path including one or more multiplexers coupled to the packet interpreter circuitry, the TAP state machine circuitry, or the compare circuitry.

14. The device of claim 13, wherein the multiplexed data path includes one or more first multiplexers to provide a signal to drive the TDI pin of the boundary scan port, the one or more first multiplexers to receive a first input from the TAP state machine circuitry, a second input from the packet interpreter circuitry, a third input from a signal driven high, a fourth input from a signal driven low, a fifth input from a signal from a test data out (TDO) pin, and a sixth input from the packet interpreter circuitry to select between the first, second, third, fourth, and fifth inputs.

15. The device of claim 13, wherein the multiplexed data path includes a second multiplexer to provide output data to the packet interpreter circuitry, the second multiplexer to receive a first input from a test data out (TDO) pin of the boundary scan port, a second input from the compare circuitry, and a third input from the packet interpreter circuitry to select between the first and second input.

16. A method comprising:
decoding, at packet interpreter circuitry of boundary scan interface circuitry of a device, an operation field of a packet;
translating, at the packet interpreter circuitry, the decoded operation to a plurality of operations to be performed at a boundary scan port of the device; and
providing, by the boundary scan interface circuitry, signals to pins of the boundary scan port that cause the boundary scan port to perform the operations.

17. The method of claim 16, further comprising:
comparing, by compare circuitry of the boundary scan interface circuitry, a first value from the packet interpreter circuitry to a second value from an output pin of the boundary scan port;
producing a first output in response to a determination that the first and second values match; and
producing a second output in response to a determination that the first and second values are different.

18. The method of claim 16, further comprising:
determining, at Test Access Port (TAP) state machine circuitry of the boundary scan interface circuitry, a sequence of values to be provided on a Test Mode Select (TMS) pin to place the boundary scan port in a state specified by the packet interpreter circuitry.

19. The method of claim 16, wherein the packet includes an operation field that indicates a read-modify-write operation is to be performed, a register identification of a register to be read, and data to be stored in the register to be read.

20. The method of claim 19, further comprising:
issuing a command to the TAP state machine circuitry to place the boundary scan port in a shift data state, issuing a command to the TAP state machine to shift one or more bits out of the register to be read, and issue a command to the TAP state machine to shift one or more bits into the register to be read.

21. A system comprising:
debug tooling to provide packets to a target system; and
a target system comprising:
a boundary scan port;
transport layer circuitry to receive the packet from the debug tooling;
packet interpreter circuitry communicatively coupled between the boundary scan port and the transport layer circuitry, the packet interpreter circuitry to translate data in the packet from the debug tooling into a sequence of commands and data to be provided to the boundary scan port;
compare circuitry coupled between the packet interpreter circuitry and the boundary scan port, the compare circuitry to compare a first value from the packet interpreter circuitry to a second value from the boundary scan port, produce a first output in response to a determination that the first and second values match, and produce a second output in response to a determination that the first and second values are different; and
Test Access Port (TAP) state machine circuitry to determine a sequence of values to be provided on a Test Mode Select (TMS) pin and a Test Data In (TDI) pin to place a TAP controller of the boundary scan port in a state specified by the packet interpreter circuitry.

22. The system of claim 21, wherein the target system further comprises a multiplexed data path including one or more multiplexers coupled to the packet interpreter circuitry, the TAP state machine circuitry, or the compare circuitry.

23. The system of claim 22, wherein the multiplexed data path includes one or more first multiplexers to provide a signal to drive the TDI pin of the boundary scan port, the one or more first multiplexers to receive a first input from the TAP state machine circuitry, a second input from the packet interpreter circuitry, a third input from a signal driven high, a fourth input from a signal driven low, a fifth input from a signal from a test data out (TDO) and a sixth input from the packet interpreter circuitry to select between the first, second, third, fourth, and fifth inputs.

24. The system of claim 23, wherein the multiplexed data path includes a second multiplexer to provide output data to the packet interpreter circuitry, the second multiplexer to receive a first input from a test data out (TDO) pin of the boundary scan port, a second input from the compare circuitry, and a third input from the packet interpreter circuitry to select between the first and second input.

25. The system of claim 21, wherein the packet is a read-modify-write operation packet that includes data indicating a read write modify operation is to be performed, a register to be read, and data to be stored in the register to be read.

* * * * *